(12) United States Patent
Rogalli et al.

(10) Patent No.: US 9,165,821 B2
(45) Date of Patent: Oct. 20, 2015

(54) METHOD FOR PROVIDING A SELF-ALIGNED PAD PROTECTION IN A SEMICONDUCTOR DEVICE

(71) Applicant: Infineon Technologies AG, Neubiberg (DE)

(72) Inventors: Michael Rogalli, Rottenburg (DE); Wolfgang Lehnert, Lintach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/138,158

(22) Filed: Dec. 23, 2013

(65) Prior Publication Data
US 2015/0179507 A1 Jun. 25, 2015

(51) Int. Cl.
*H01L 21/768* (2006.01)
*H01L 21/02* (2006.01)
*H01L 21/3213* (2006.01)

(52) U.S. Cl.
CPC .... *H01L 21/76829* (2013.01); *H01L 21/02178* (2013.01); *H01L 21/02205* (2013.01); *H01L 21/02271* (2013.01); *H01L 21/32139* (2013.01)

(58) Field of Classification Search
CPC .................................................. H01L 21/32139

USPC ........................................................... 438/669
See application file for complete search history.

(56) References Cited

U.S. PATENT DOCUMENTS

2013/0147032 A1* 6/2013 Jeng et al. ..................... 257/737

OTHER PUBLICATIONS

K. Sethi et al., Conformal Atomic Layer Deposition (ALD) of alumina on high surface-area porous copper electrodes to achieve ultra-high capacitance density on silicon interposers, Electronic Components and Technology Conference (ECTC), 2011 IEEE 61st, pp. 1928-1932.
A.I.Abdulagatov et al., Al2o3 and Tio2 Atomic Layer Deposition on Copper for Water Corrosion Resistance, ACS Appl. Mater. Interfaces, 2011, 3 (12), pp. 4593-4601.

* cited by examiner

*Primary Examiner* — Mamadou Diallo

(57) ABSTRACT

According to one embodiment, a method for processing a semiconductor device is provided including forming a final metal layer forming a passivation layer over the final metal layer and structuring the passivation layer and the final metal layer to form a patterned metal layer and a patterned passivation layer, wherein the patterned metal layer includes a pad region covered by the patterned passivation layer.

25 Claims, 6 Drawing Sheets

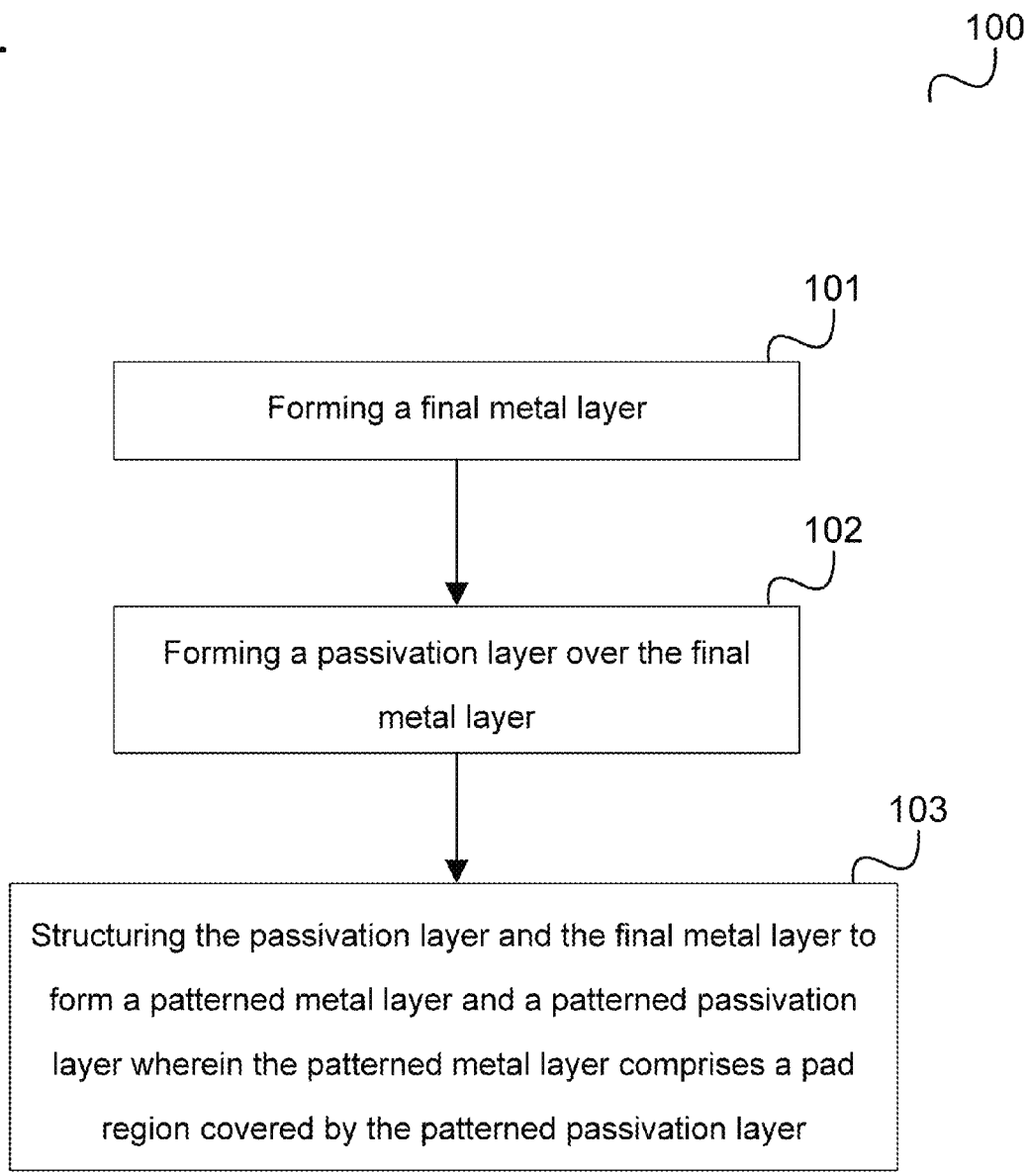

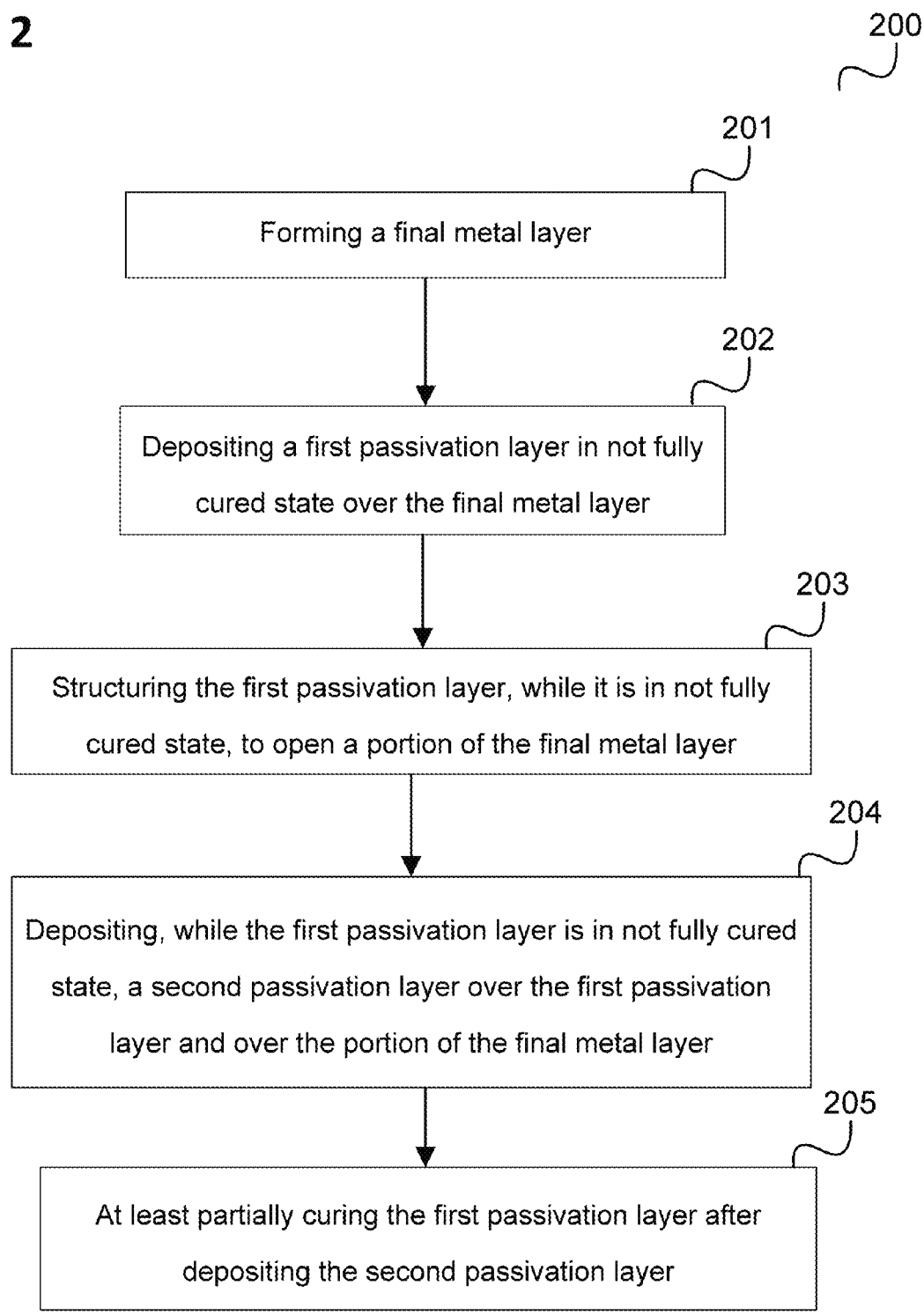

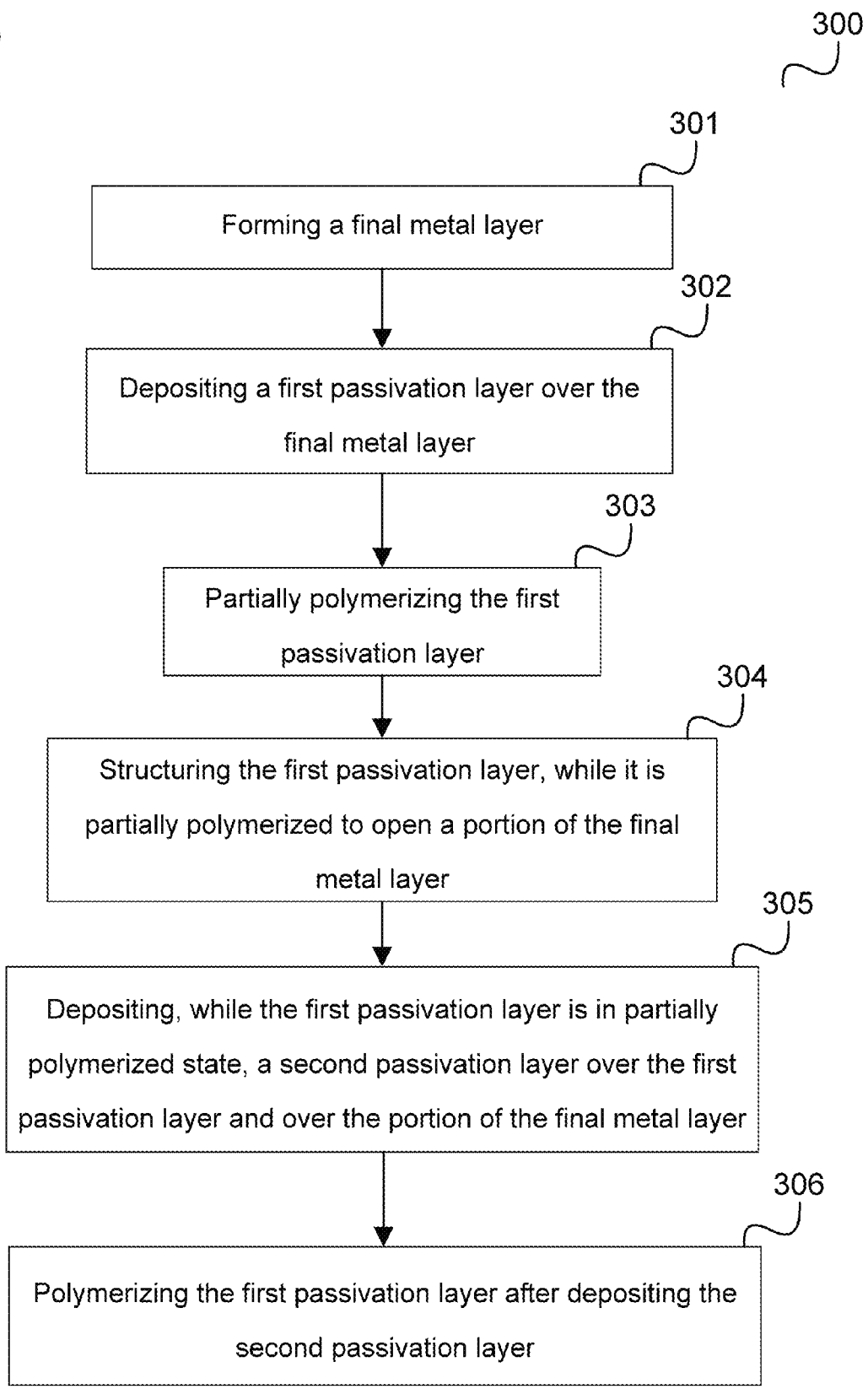

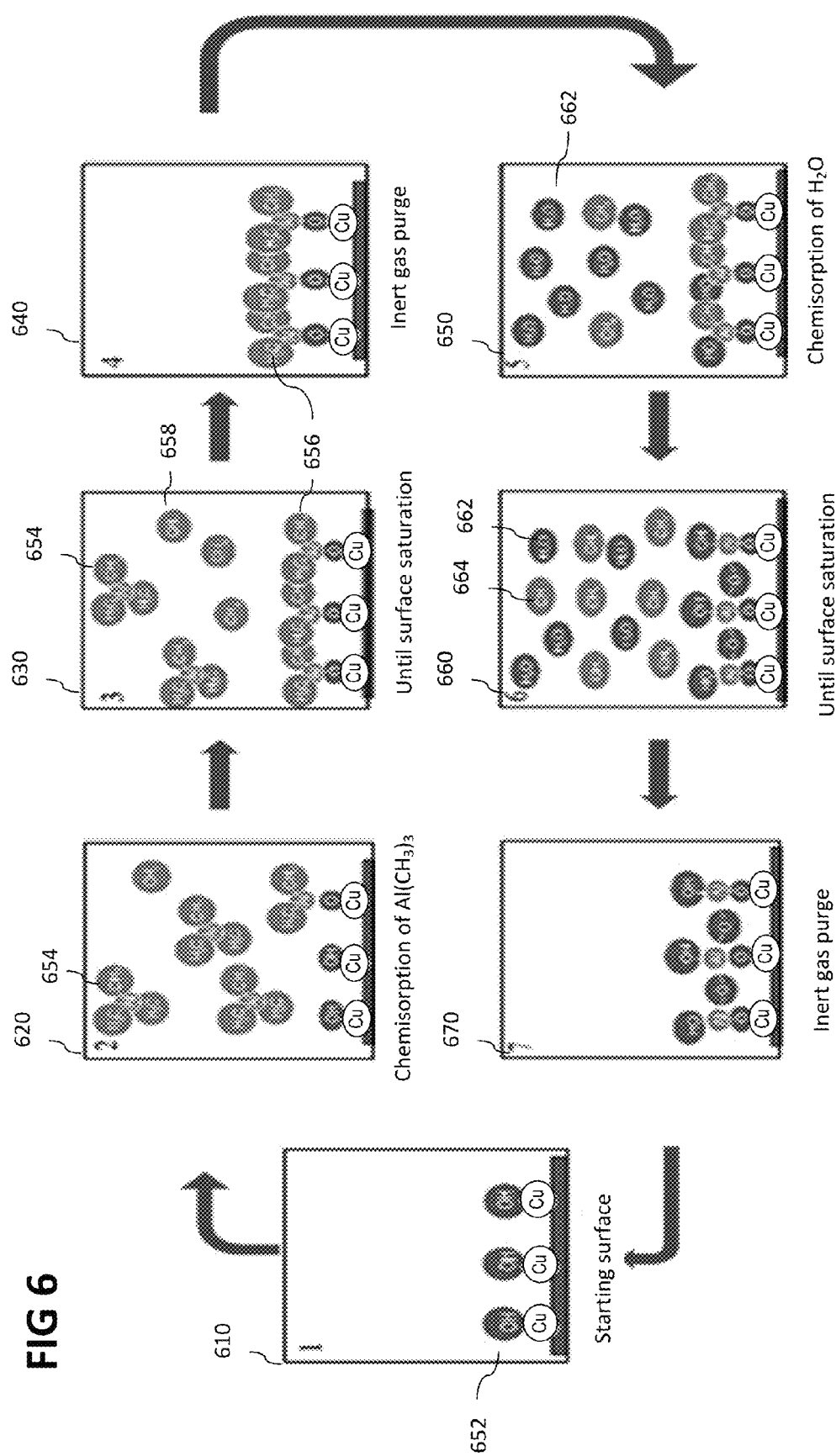

METHOD FOR PROVIDING A SELF-ALIGNED PAD PROTECTION IN A SEMICONDUCTOR DEVICE

TECHNICAL FIELD

Various embodiments relate generally to methods for processing a semiconductor device.

BACKGROUND

Typically, a semiconductor device requires a final metal (or metallization) layer. For this, a metal layer is for example deposited over the whole surface of the semiconductor device, e.g. an aluminum layer is deposited by means of a sputter process, is structured and passivated (e.g. by means of a stack including a plasma oxide layer and a nitride layer deposited by means of chemical vapor deposition). Alternatively, metal may be plated in a resist mask that is already structured (e.g. galvanic deposition of copper).

However, for final assembly of the semiconductor device open portions of the metal layer (i.e. open bonding pads) are typically required. Opening the passivation layer by means of etching using halogens typically leads to contamination of the opened pads which may corrode in the course of going from frontend processing to backend processing and during backend processing (e.g. sawing). This may lead to high fluctuations of bonding quality. In an extreme case, a pad may not be bondable (NSOP, non stick on pad problem). Further, the corroded pads may lower reliability of the finished semiconductor device.

SUMMARY

According to one embodiment a method for processing a semiconductor device is provided including forming a final metal layer, forming a passivation layer over the final metal layer and structuring the passivation layer and the final metal layer to form a patterned metal layer and a patterned passivation layer, wherein the patterned metal layer includes a pad region covered by the patterned passivation layer.

According to another embodiment, a method for processing a semiconductor device is provided including forming a final metal layer, depositing a first passivation layer in not fully cured state over the final metal layer, structuring the first passivation layer, while it is in not fully cured state, to open a portion of the final metal layer, depositing, while the first passivation layer is in not fully cured state, a second passivation layer over the first passivation layer and over the portion of the final metal layer and, after depositing the second passivation layer, at least partially curing the first passivation layer.

According to a further embodiment, a method for processing a semiconductor device is provided including forming a final metal layer, depositing a first passivation layer over the final metal layer, partially polymerizing the first passivation layer, structuring the first passivation layer, while it is in partially polymerized state, to open a portion of the final metal layer, depositing, while the first passivation layer is in partially polymerized state, a second passivation layer over the first passivation layer and over the portion of the final metal layer and, after depositing the second passivation layer, polymerizing the first passivation layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a flow diagram illustrating method for processing a semiconductor device according to an embodiment.

FIG. 2 shows a flow diagram illustrating method for processing a semiconductor device according to another embodiment.

FIG. 3 shows a flow diagram illustrating method for processing a semiconductor device according to a further embodiment.

FIG. 6 shows various views illustrating a process principle of an atomic layer deposition process that may be used to grow a layer including aluminum oxide in a method for processing a semiconductor device according to various embodiments.

DETAILED DESCRIPTION

Figure 4A:
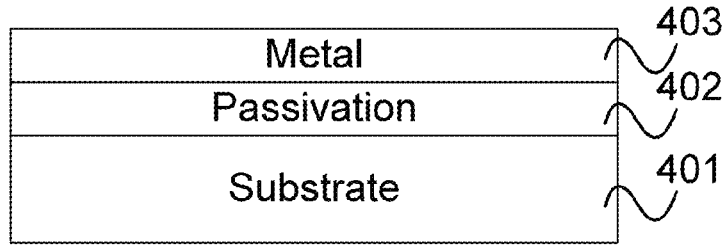
FIGS. 4A to 4E show various stages in a method for processing a semiconductor device according to an embodiment.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described for structures or devices, and various embodiments are described for methods. It may be understood that one or more (e.g. all) embodiments described in connection with structures or devices may be equally applicable to the methods, and vice versa.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

In one or more embodiments, the term "final metal layer" may include a metal layer of a final metallization level (e.g. top metallization level) of a semiconductor device (for example, of a wafer or chip including the semiconductor device).

A final metal layer may be passivated using a dielectric material such as $Al_2O_3$, for example deposited by means of atomic layer deposition (ALD). In this approach, the dielectric material may be deposited over the whole metal layer (referred to as ALD inside) or over the final wafer surface which includes a polyimide layer and one or more open pads (referred to as ALD on top). This approach may be easily implemented in a manufacturing process. Further, this approach requires low cost which does not require additional structuring. However, with this approach, an additional interface is formed between metallization layer and passivation layer, passivation layer and polyimide layer and polyimide layer and mold compound, respectively. This leads to an increased complexity of the structure and may in the worst case lead to problems at the various interfaces.

In view of the above, according to various embodiments, methods for processing a semiconductor device are provided which may be seen to generate a self-aligned pad protection. Such methods are described in the following.

FIG. 1 shows a flow diagram 100 illustrating a method for processing a semiconductor device according to an embodiment.

In 101, a final metal layer is formed.

In 102, a passivation layer is formed over the final metal layer.

In 103, the passivation layer and the final metal layer are structured to form a patterned metal layer and a patterned passivation layer, wherein the patterned metal layer includes a pad region covered by the patterned passivation layer.

According to one embodiment, in other words, a passivation layer deposited on a final metal layer (metallization layer) is structured together (i.e. for example using the same mask) with the final metal layer of a semiconductor device. For example, a passivation layer is deposited using ALD to cover the whole final metal layer (e.g. an aluminum metal layer) before structuring the final metal layer. The passivation layer and the metal layer are then structured, e.g. by etching using a patterned resist as an etch mask. Having parts of the passivation layer between the final metal layer and the resist leads to a self-aligned pad protection after etching. Namely, the passivation layer is removed in regions where also the metal layer is removed. However, the passivation layer remains in regions where the metal layer is not removed, e.g. where the metal layer is not removed to form bonding pads.

The passivation layer for example includes a metal oxide.

For example, the metal oxide is an oxide which is different from a native oxide of the material of the final metal layer.

The passivation layer for example includes aluminum oxide.

According to one embodiment, the passivation layer is formed over the final metal layer by means of an atomic layer deposition (ALD) process. Alternatively to an ALD layer, in various embodiments, a layer including $SiO_2$, $TiO_2$, one or more anorganic materials and combinations thereof may be used. The passivation layer may also be doped.

The atomic layer deposition process for example includes an aluminum precursor including trimethylaluminum.

According to one embodiment, the atomic layer deposition process includes at least one oxidizing precursor from the following group of oxidizing precursors, the group of oxidizing precursors consisting of: water, alcohol, isopropanol, ethanol and methanol.

The passivation layer is for example formed over the whole surface of the final metal layer, e.g. over the whole wafer including the semiconductor device.

According to one embodiment, structuring the passivation layer and the final metal layer includes forming a mask, patterning the mask and etching the passivation layer and the metal layer using the patterned mask.

The mask for example includes an etch resist.

The mask for example covers the pad region.

According to one embodiment, etching the passivation layer and the metal layer includes dry etching or wet etching the passivation layer and the metal layer.

According to one embodiment, the final metal layer includes at least one metal from the following group of metals, the group of metals consisting of: copper, silver, palladium, tungsten, aluminum and tin.

According to one embodiment, the final metal layer may be formed at a front side of the semiconductor device, e.g. at a front side of a wafer or chip including the semiconductor device. According to another embodiment, the final metal layer may be formed at a back side of the semiconductor device, e.g. at a back side of a wafer or chip including the semiconductor device.

The final metal layer is for example formed over the whole surface of the semiconductor device, e.g. over the whole surface of the wafer or chip, e.g. over the whole front side or back side of the wafer or chip.

FIG. 2 shows a flow diagram 200 illustrating method for processing a semiconductor device according to another embodiment.

In 201, a final metal layer is formed.

In 202, a first passivation layer in not fully cured state is deposited over the final metal layer.

In 203, the first passivation layer is structured, while it is in not fully cured state, to open a portion of the final metal layer.

In 204, while the first passivation layer is in not fully cured state, a second passivation layer is deposited over the first passivation layer and over the portion of the final metal layer.

In 205, after depositing the second passivation layer, the first passivation layer is at least partially cured.

According to one embodiment, in other words, a first passivation layer is formed on a final metal layer (e.g. by spin coating) and is only pre-cured (i.e. not fully cured, e.g. soft baked), in other words partially cured, e.g. partially polymerized. This may for example mean that the first passivation layer is largely cured, e.g. is cured to 90% or more, 95% or more or 99% or more. The first passivation layer is structured and a second passivation layer is then formed on the structured first passivation layer such that it covers areas where the first passivation layer is present after structuring and areas where the first passivation layer is not present after structuring such that the second passivation directly covers the metal layer in these areas. By further curing (e.g. completely curing or at least further partially curing) the first passivation layer, the second passivation layer may be removed in areas where the first passivation layer is present after structuring, i.e. where the second passivation layer covers the first passivation layer.

The second passivation layer is for example formed on the structured first passivation layer at a temperature that is below the curing temperature of the first passivation layer.

For example, the structured first passivation layer is a structured organic precursor (e.g. a photo sensitive polyimide) and a second passivation layer is deposited by means of atomic layer deposition. The second passivation layer is formed when the first passivation layer is pre-polymerized. For example, the polyimide is processed by a hard bake, e.g. between 300° C. and 400° C., or 250° C. to 400° C., for a period of 200 s to 400 s, e.g. 300 s. After deposition of the second passivation layer, e.g. to cover the whole wafer, the first passivation layer is finally cross-linked, i.e. at least substantially completely cured. Due to the typically massive shrinkage of the first passivation layer during curing, the second passivation layer on the first passivation layer is removed while the second passivation layer remains in areas where it was directly deposited on the metal layer.

According to one embodiment, during curing of the first passivation layer the first passivation layer shrinks and portions of the second passivation layer deposited on the first passivation layer detach from the first passivation layer or sink into the first passivation layer.

The first passivation layer for example includes an organic precursor.

For example, the first passivation layer includes an imide.

According to one embodiment, the first passivation layer includes a photosensitive polyimide.

At least partially curing the first passivation layer may for example include curing the first passivation to a state that is more fully cured than the not fully cured state.

At least partially curing the first passivation layer for example includes hard baking the first passivation layer.

At least partially curing the first passivation for example includes polymerizing the first passivation layer.

The second passivation layer for example includes a metal oxide.

The metal oxide is for example an oxide which is different from a native oxide of the material of the final metal layer.

For example, the second passivation layer includes aluminum oxide.

The second passivation layer is for example deposited by means of an atomic layer deposition process.

The atomic layer deposition process may include an aluminum precursor including trimethylaluminum.

According to one embodiment, the atomic layer deposition process includes at least one oxidizing precursor from the following group of oxidizing precursors, the group of oxidizing precursors consisting of: water, alcohol, isopropanol, ethanol and methanol.

According to one embodiment, the second passivation layer is formed over the whole surface of the first passivation layer and the portion of the metal layer, e.g. over the whole wafer including the semiconductor device.

Structuring the first passivation layer for example includes forming a mask, patterning the mask and etching the first passivation layer using the patterned mask.

The mask for example includes an etch resist.

Etching the first passivation layer for example includes dry etching or wet etching the first passivation layer.

According to one embodiment, the final metal layer includes at least one metal from the following group of metals, the group of metals consisting of: copper, silver, palladium, silver, tungsten, aluminum and tin.

According to one embodiment, the final metal layer may be formed at a front side of the semiconductor device, e.g. at a front side of a wafer or chip including the semiconductor device. According to another embodiment, the final metal layer may be formed at a back side of the semiconductor device, e.g. at a back side of a wafer or chip including the semiconductor device.

The final metal layer is for example formed over the whole surface of the semiconductor device, e.g. over the whole surface of the wafer or chip, e.g. over the whole front side or back side of the wafer or chip.

FIG. 3 shows a flow diagram 300 illustrating method for processing a semiconductor device according to a further embodiment.

The flow diagram 300 illustrates a method for processing a semiconductor device.

In 301, a final metal layer is formed.

In 302, a first passivation layer is formed over the final metal layer.

In 303, the first passivation layer is partially polymerized.

In 304, the first passivation layer is structured while it is in partially polymerized state to open a portion of the final metal layer;

In 305 a second passivation layer is deposited over the first passivation layer and over the portion of the final metal layer while the first passivation layer is in partially polymerized state.

In 306, the first passivation layer is polymerized after depositing the second passivation layer.

It should be noted that, where applicable, embodiments described in context of the method illustrated in FIG. 1 are analogously valid for the methods illustrated in FIGS. 2 and 3 and vice versa.

In the following, examples for the methods of FIGS. 1 to 3 are described in more detail.

FIGS. 4A to 4E show various stages in a method for processing a semiconductor device according to an embodiment.

The processing method as illustrated in FIGS. 4A to 4E can be seen as an example for the method described with reference to FIG. 1.

As shown in FIG. 4A, a passivation layer 402 is provided on a substrate 401. The substrate 401 may include various doped or undoped semiconductor regions, insulating regions, metal layers etc. to form one or more semiconductor device components, e.g. transistors etc. The passivation layer 402 for example includes an insulating material for example including a stack consisting of silicon nitride, silicon oxide, or various combinations of both. On the passivation layer 402, a final metal layer 403 is formed. The metal layer 403 for example includes aluminum or copper, e.g. deposited using physical vapor deposition (PVD).

Figure 4B:
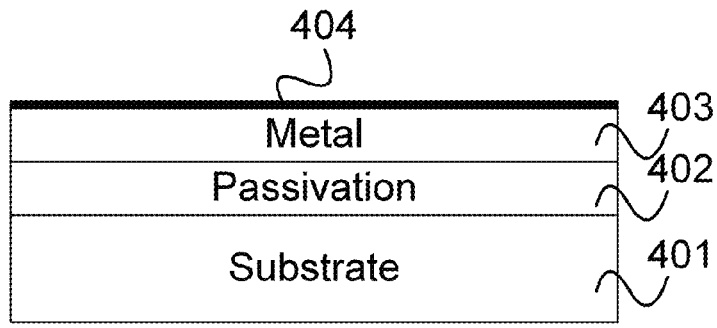

As shown in FIG. 4B, an ALD (passivation) layer 404 which may be seen to correspond to the passivation layer described with reference to FIG. 1, is deposited by means of ALD, e.g. an $Al_2O_3$ layer.

Figure 4C:
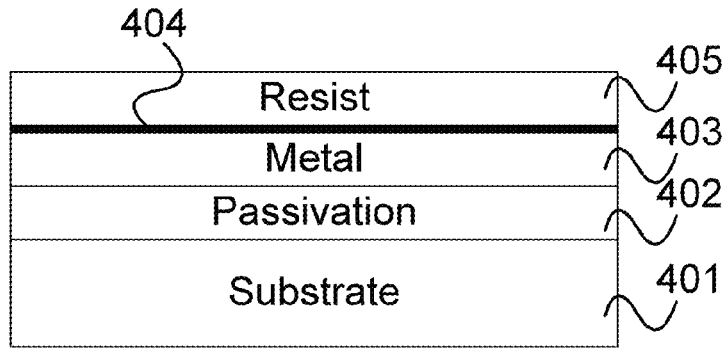
Figure 4D:
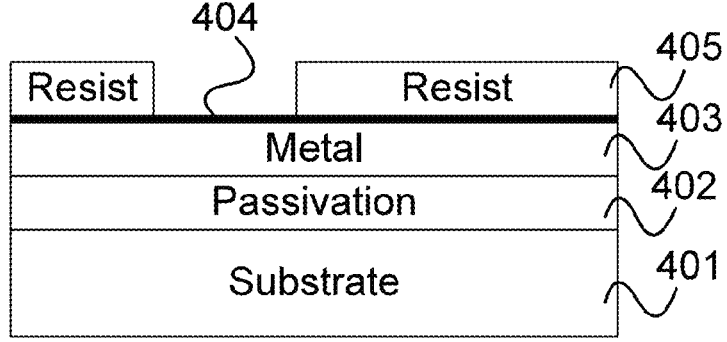

The ALD passivation layer 404 is then structured together with the metal layer 403. For this, as illustrated in FIG. 4C, a resist layer 405 is formed on the ALD passivation layer 404 and the resist layer 405 is patterned as shown in FIG. 4D to form an etch mask 405 over the ALD passivation layer 404.

A wet etch process is then carried out using the etch mask 405 using an etchant which can etch the material of the metal layer 403 as well as the ALD passivation layer 404 (e.g. 0.1% HF). The differences in the etching rates between metal and metal oxide, in this example Al and $Al_2O_3$, (e.g. a factor of above 10) leads to a complete removal of the ALD passivation layer in all areas where the resist is opened and at the side walls of the aluminum. Since the ALD layer 404 is not present on the side walls of the (structured) metal layer 403 and on the opened areas of the passivation layer 402, no additional interface is created. The hole in the metal layer 403 above the opened area of the passivation layer 402 generates by etching may for example form a via that is filled with an additional (e.g. a final) passivation layer, e.g. an oxide, a nitride or mold).

Figure 4E:
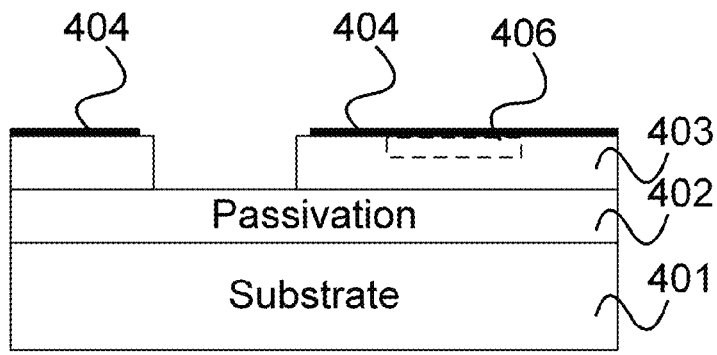

The result of the etching is illustrated in FIG. 4E. The undercut of the ALD passivation layer 404 between metal layer 403 and the resist 405 is typically negligible (typically approx. 5 um).

A final passivation layer (e.g. including an imide) may be formed which is for example only opened in areas to be used for bonding, such as bond pad region 406 (which for example does not differ from the rest of the metal layer 403). In such areas, the ALD layer is still present and the opening of the final passivation layer is stopped at the ALD layer 404. Thus the opened area (e.g. bond pad region 406) is protected against corrosion. For example, the metal layer 403 is protected by pure (fluorine free) alumina of the ALD layer 404 and is thus well protected against corrosion. Since only the areas to be used for bonding and covered areas of the metal layer 403 have a protective ALD layer 404, e.g. a $Al_2O_3$ layer, problems of adhesion between the final passivation layer (on the ALD layer 404 and the metal layer 403) or possible leak current paths between metal lines of the metal layer 403 via the ALD layer 404 are avoided.

Bonding to the bond pad region 406 may be done by breaking through the thin layer (for example about 5 nm to about 10 nm) of the, for example, aluminum oxide of the ALD layer 404.

Since the metal layer 403 is well protected from the external environment by ALD layer 404 the semiconductor device may be transported from the front end processing facilities to back end processing facilities without exposing the metal layer to oxidation and contamination and is protected from corrosion and contamination during backend processing, e.g. sawing.

FIGS. 5A to 5D show various stages in a method for processing a semiconductor device according to an embodiment.

The processing method as illustrated in FIGS. 5A to 5D can be seen as an example for the methods described with reference to FIG. 2 or 3, respectively.

Figure 5A:
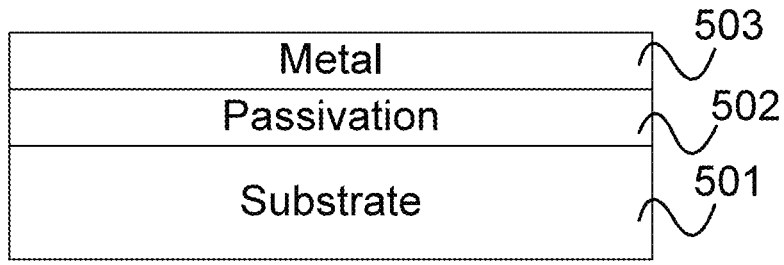
FIGS. 5A to 5D show various stages in a method for processing a semiconductor device according to an embodiment.

As shown in FIG. 5A, a passivation layer 502 is provided on a substrate 501. The substrate 501 may include various doped or undoped regions, insulating regions, metal layers etc. to form one or more semiconductor device components, e.g. transistors etc. The passivation layer 502 for example includes an insulating material for example including a stack consisting of silicon nitride, silicon oxide, or various combinations of both. On the passivation layer 502, a final metal layer 503 is formed. The metal layer 403 for example includes aluminum or copper, e.g. deposited using physical vapor deposition (PVD).

Figure 5B:
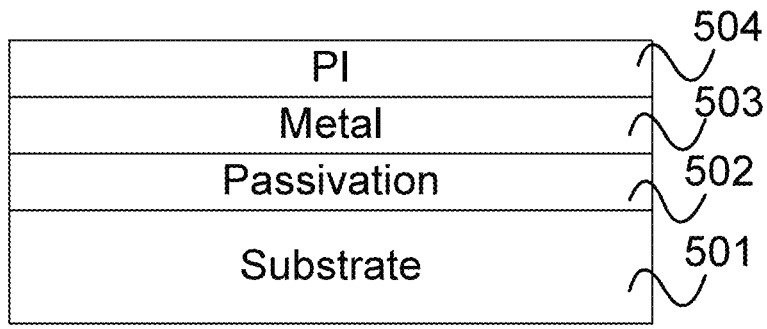
Figure 5C:
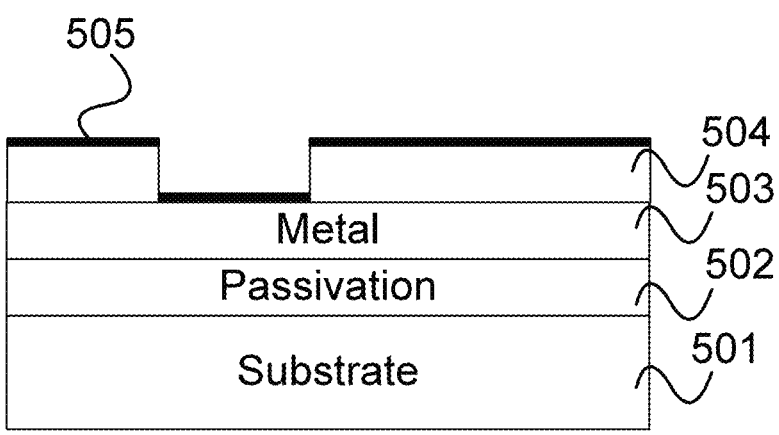

As shown in FIG. 5B, a polyimide layer 504 is then formed over (for example on) the metal layer 503. It should be noted that between the metal layer 503 and the polyimide layer 504, one or more additional layers may be formed, e.g. a nitride layer such as silicon nitride. The polyimide layer 504 is pre-cured, i.e. partially cured (e.g. by hard bake), in other words pre-polymerized. The polyimide layer 504 is then structured, e.g. using photolithography, and an ALD (passivation) layer 505 is deposited on the structured polyimide layer 504 as shown in FIG. 5C. The ALD layer 505 is deposited at a temperature which is below the curing temperature of the polyimide layer 504, e.g. between 100° C. and 200° C. It has for example a thickness of 5 nm to 10 nm.

Figure 5D:
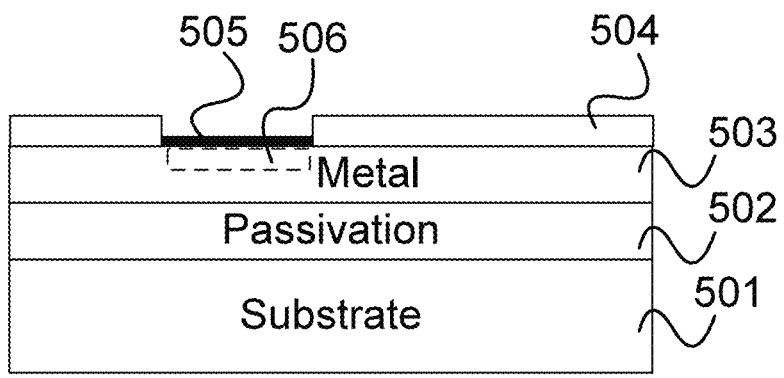

Then the polyimide layer 504 is further (e.g. completely) cured. Since in this process, as shown in FIG. 5D, the polyimide layer 504 shrinks (e.g. to approx. 40% of its original thickness (e.g. 10 nm to 40 nm), e.g. to a thickness of 5 um to 20 um), the ALD layer 505 detaches from the polyimide and only remains in areas where it was formed on the metal layer 503. Thus, areas for bonding, such as bond pad region 506 are protected by ALD layer 505.

FIG. 6 shows various views illustrating a process principle of an atomic layer deposition process that may be used to grow a layer including aluminum oxide, e.g. an aluminum oxide layer, such as layer 404, over a metal layer such as metal layer 403 in a method for processing a semiconductor device according to various embodiments. In the following description, it is assumed that metal layer 403 includes or consists of copper, however metal layer 403 may include other metals or metal alloys in accordance with other embodiments such as aluminum.

Views 610 to 670 show an illustration of an initial reaction cycle in ALD growth of layer 404 including aluminum oxide, wherein in situ Cu-oxide reduction and passivation by layer 404 including aluminum oxide may be achieved.

In an example, layer 404 including aluminum oxide, i.e. the protection layer for the copper of metal layer 403, may be applied and/or deposited after the final conditioning of metal layer 403, e.g. after crystallization of copper and/or tempering processes. An annealing process prior to the deposition of layer 404 including aluminum oxide may result in a desired crystallization of the final metallization.

Forming gas, e.g. a mixture of nitrogen and hydrogen may reduce any copper oxide formed in metal layer 403 to copper. Due to various reasons though, e.g. even after the use of forming gas, a thin native oxide 652, e.g. copper oxide, may still be present on surfaces, e.g. top side of metal layer 403. Oxidizing precursors, such as water and/or alcohol e.g. isopropanol or ethanol or methanol, may be introduced on surfaces of metal layer 403 (in view 610).

In view 620, an aluminum ALD precursor 654 may be introduced over metal layer 403. This aluminum precursor 654 typically may be trimethylaluminum ($Al(CH_3)_3$) (TMA).

As shown in view 620, the aluminum ALD precursor 654 (here: TMA) may be able to reduce the native oxide 652 at the initial stage of ALD growth of aluminum oxide. As shown in 620, TMA 654 may be chemisorbed at the oxidized metal pad surface via Al—O—Cu bonds replacing Al—$CH_3$ bonds of the TMA 654, until surface saturation with chemisorbed TMA 656 occurs, as shown in view 630. Excess $CH_3$ groups 658 as well as excess TMA 654 may be purged with inert gas as shown in view 640.

In view 650, an oxidizing precursor, e.g. water 662 (as shown in view 650) and/or alcohols (e.g. isopropanol (WA), not shown in view 650), may be introduced to replace methyl groups of chemisorbed TMA 654 with OH groups and form Al—O—Al bonds between neighboring chemisorbed TMA 654 molecules. Chemisorption of water and/or alcohols may occur until surface saturation as shown in view 660.

Purging with inert gas may be carried out in view 670 to remove excess methyl groups 664 and water 662 (and/or alcohols). The surface structure shown in view 670 then may serve as a starting surface for a further ALD reaction cycle. During the use of ALD for deposition of aluminum oxide layer 404, no copper oxide may be formed or created, due to the reducing effect of the TMA. Furthermore, as TMA reduces the copper oxide, layer 404 including aluminum oxide may be formed and/or deposited directly onto the copper surface as a result.

The typical process temperatures may lie in a wide temperature window, e.g. ranging from about room temperature to about 450° C., e.g. between about 80° C. to about 400° C. which may be fully compatible with Cu. In cases where copper may be especially susceptible to corrosion, e.g. by water, the deposition may be carried out with TMA and alcohol, e.g. isopropanol, instead of water.

It may be understood that disposing layer 404 including aluminum oxide over metal layer 403 may include forming a chemical reaction at the surface of metal layer 403 such that oxides of copper are removed from the metal layer 403.

Disposing layer 404 including aluminum oxide over metal layer 403 may include disposing layer 404 including aluminum oxide over metal layer 403 such that layer 404 including aluminum oxide prevents formation of an oxide of copper at a surface of metal layer 403.

Disposing layer 404 including aluminum oxide over metal layer 403 may include disposing layer 404 including aluminum oxide over metal layer 403 wherein layer 404 including aluminum oxide may prevent growth of copper structures from metal layer 403. The atomic layer deposition process may include an aluminum precursor, typically trimethylaluminum (TMA), and an oxidizing precursor, typically water or oxygen and/or ozone, in accordance with some embodiments. In accordance with other embodiments, the atomic layer deposition process of aluminum oxide may include alcohol (e.g. isopropanol) as oxidizing precursors.

The cycle (as illustrated according to view 610 to 670) may be repeated until a desired thickness of layer 404 including aluminum oxide may be obtained.

Various embodiments provide a protective layer including aluminum oxide, for copper. Aluminum oxide layer 404, e.g. amorphous aluminum oxide, may be stable against environmental influences, e.g. heating, and sufficiently sealed against moisture. Even with heating up to 300° C., layer 404 including aluminum oxide may remain stable over copper pad 403, without degrading. Furthermore, the formation of copper oxide may be prevented.

Layer 404 including aluminum oxide may be deposited using ALD thereby producing an excellent conformal coating over metal structures, e.g. metal layer 403. Layer 404 including aluminum oxide may provide excellent copper protection against oxidation. Furthermore, depositing layer 404 including aluminum oxide using ALD may remove initial metal oxide layers, e.g. copper oxide, during the first cycle of the aluminum precursor. Layer 404 including aluminum oxide may provide excellent protection against electrochemistry and therefore no dendrite growth. Layer 404 including aluminum oxide may provide excellent cost of ownership (CoO), meaning deposition may be cheap, using only very thin aluminum oxide layers, e.g. about 5 nm, or using e.g. a batch process, for example by deposition in a vertical furnace. Layer 404 including aluminum oxide may also be used to protect other metal surfaces and may be deposited on almost every material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a semiconductor device, comprising:
    forming a final metal layer;
    forming a passivation layer over the final metal layer;
    structuring the passivation layer and the final metal layer together to form a patterned metal layer and a patterned passivation layer, wherein the patterned metal layer comprises a pad region covered by the patterned passivation layer.

2. The method according to claim 1, wherein the passivation layer comprises a metal oxide.

3. The method according to claim 2, wherein the metal oxide is an oxide which is different from a native oxide of the material of the final metal layer.

4. The method according to claim 1, wherein the passivation layer comprises aluminum oxide.

5. The method according to claim 1, wherein the passivation layer is formed over the final metal layer by means of an atomic layer deposition process.

6. The method according to claim 5, wherein the atomic layer deposition process comprises an aluminum precursor comprising trimethylaluminum.

7. The method according to claim 5, wherein the atomic layer deposition process comprises at least one oxidizing precursor from the following group of oxidizing precursors, the group of oxidizing precursors consisting of: water, alcohol, isopropanol, ethanol and methanol.

8. The method according to claim 1, wherein the passivation layer is formed over the whole surface of the final metal layer.

9. The method according to claim 1, wherein structuring the passivation layer and the final metal layer comprises forming a mask, patterning the mask and etching the passivation layer and the metal layer using the patterned mask.

10. The method according to claim 9, wherein the mask comprises an etch resist.

11. The method according to claim 9, wherein the mask covers the pad region.

12. The method according to claim 1, wherein etching the passivation layer and the metal layer comprises dry etching or wet etching the passivation layer and the metal layer.

13. The method according to claim 1, wherein the final metal layer comprises at least one metal from the following group of metals, the group of metals consisting of: copper, silver, palladium, tungsten, aluminum and tin.

14. A method for processing a semiconductor device, comprising:
    forming a final metal layer;
    forming a passivation layer over the final metal layer;
    structuring the passivation layer and the final metal layer to form a patterned metal layer and a patterned passivation layer, wherein the patterned metal layer comprises a pad region covered by the patterned passivation layer, wherein structuring the passivation layer and the final metal layer comprises forming a mask, patterning the mask and etching the passivation layer and the metal layer using the patterned mask.

15. The method according to claim 14, wherein the passivation layer comprises a metal oxide.

16. The method according to claim 15, wherein the metal oxide is an oxide which is different from a native oxide of the material of the final metal layer.

17. The method according to claim 14, wherein the passivation layer comprises aluminum oxide.

18. The method according to claim 14, wherein the passivation layer is formed over the final metal layer by means of an atomic layer deposition process.

19. The method according to claim 18, wherein the atomic layer deposition process comprises an aluminum precursor comprising trimethylaluminum.

20. The method according to claim 18, wherein the atomic layer deposition process comprises at least one oxidizing precursor from the following group of oxidizing precursors, the group of oxidizing precursors consisting of: water, alcohol, isopropanol, ethanol and methanol.

21. The method according to claim 14, wherein the passivation layer is formed over the whole surface of the final metal layer.

22. The method according to claim 14, wherein the mask comprises an etch resist.

23. The method according to claim 14, wherein the mask covers the pad region.

24. The method according to claim 14, wherein etching the passivation layer and the metal layer comprises dry etching or wet etching the passivation layer and the metal layer.

25. The method according to claim 14, wherein the final metal layer comprises at least one metal from the following group of metals, the group of metals consisting of: copper, silver, palladium, tungsten, aluminum and tin.

* * * * *